(12) United States Patent
Lee

(10) Patent No.: US 11,043,656 B2
(45) Date of Patent: Jun. 22, 2021

(54) DISPLAY DEVICE INCORPORATING A SCATTERING PATTERN

(71) Applicant: Samsung Display Co., Ltd., Yongin-Si (KR)

(72) Inventor: Hyeonbum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/660,346

(22) Filed: Oct. 22, 2019

(65) Prior Publication Data

US 2020/0266392 A1  Aug. 20, 2020

(30) Foreign Application Priority Data

Feb. 19, 2019 (KR) .................. 10-2019-0019007

(51) Int. Cl.
| | | |
|---|---|---|
| H01L 51/52 | (2006.01) | |
| H01L 27/32 | (2006.01) | |
| G06F 3/044 | (2006.01) | |
| G06F 3/041 | (2006.01) | |

(52) U.S. Cl.
CPC ........ *H01L 51/5281* (2013.01); *G06F 3/0412* (2013.01); *G06F 3/0446* (2019.05); *H01L 27/322* (2013.01); *H01L 27/323* (2013.01); *H01L 27/3246* (2013.01); *H01L 27/3272* (2013.01); *G06F 2203/04111* (2013.01); *G06F 2203/04112* (2013.01)

(58) Field of Classification Search
CPC ...... G06F 3/0412; G06F 3/044; G06F 3/0445; G06F 3/0446; G06F 3/0448; G06F 2203/04111; G06F 2203/04112; G06F 3/0443; G09G 3/32; G09G 3/3208; G09G 3/3233–3258; G09G 3/36; (Continued)

(56) References Cited

U.S. PATENT DOCUMENTS

| | | |
|---|---|---|
| 7,579,775 B2 | 8/2009 | Song et al. |
| 7,659,662 B2 | 2/2010 | Song et al. |

(Continued)

FOREIGN PATENT DOCUMENTS

| | | |
|---|---|---|
| KR | 10-0683734 | 2/2007 |
| KR | 10-0912802 | 8/2009 |

(Continued)

*Primary Examiner* — Nathan Danielsen
(74) *Attorney, Agent, or Firm* — H.C. Park & Associates, PLC

(57) ABSTRACT

A display device includes a window including pixel areas and a light shielding area, a display panel including a base substrate, a pixel definition layer disposed on the base substrate and including a plurality of openings respectively overlapping the pixel areas, and organic light emitting diodes respectively overlapping the openings and emitting a light through the openings, and an input sensing unit disposed between the window and the display panel. The input sensing unit includes a first conductive layer including a first conductive pattern disposed on the display panel, a first insulating layer covering the first conductive pattern and including a scattering pattern overlapping at least one pixel area among the pixel areas, a second conductive layer including a second conductive pattern disposed on the upper surface of the first insulating layer, and a second insulating layer covering the second conductive pattern on the first insulating layer.

21 Claims, 17 Drawing Sheets

(58) Field of Classification Search
CPC ..... G09G 2300/0439; G09G 2300/046; G09G
2320/02; G09G 2320/0233–0242; G09G
2320/0626; G09G 2320/066; G09G
2320/068; H01L 27/322; H01L 27/3225;
H01L 27/323; H01L 27/3246; H01L
27/3272; H01L 27/3283; H01L 51/5275;
H01L 51/5281
See application file for complete search history.

(56) References Cited

U.S. PATENT DOCUMENTS

| | | |
|---|---|---|
| 9,069,521 B2 | 6/2015 | Lee et al. |
| 9,655,235 B2 | 5/2017 | Hwang et al. |
| 2011/0310085 A1* | 12/2011 | Mimura ................. G06F 3/041 345/214 |
| 2013/0037828 A1* | 2/2013 | Moon ................. H01L 27/1218 257/88 |
| 2016/0195987 A1* | 7/2016 | Lin ....................... G06F 3/0412 345/173 |
| 2018/0011385 A1 | 1/2018 | Kagn et al. |
| 2018/0136748 A1* | 5/2018 | Li ........................... G06F 3/041 |
| 2019/0129554 A1* | 5/2019 | Kim ....................... G06F 3/041 |

FOREIGN PATENT DOCUMENTS

| | | |
|---|---|---|
| KR | 10-2014-0015881 | 2/2014 |
| KR | 10-2014-0033546 | 3/2014 |
| KR | 10-2018-0005327 | 1/2018 |

* cited by examiner

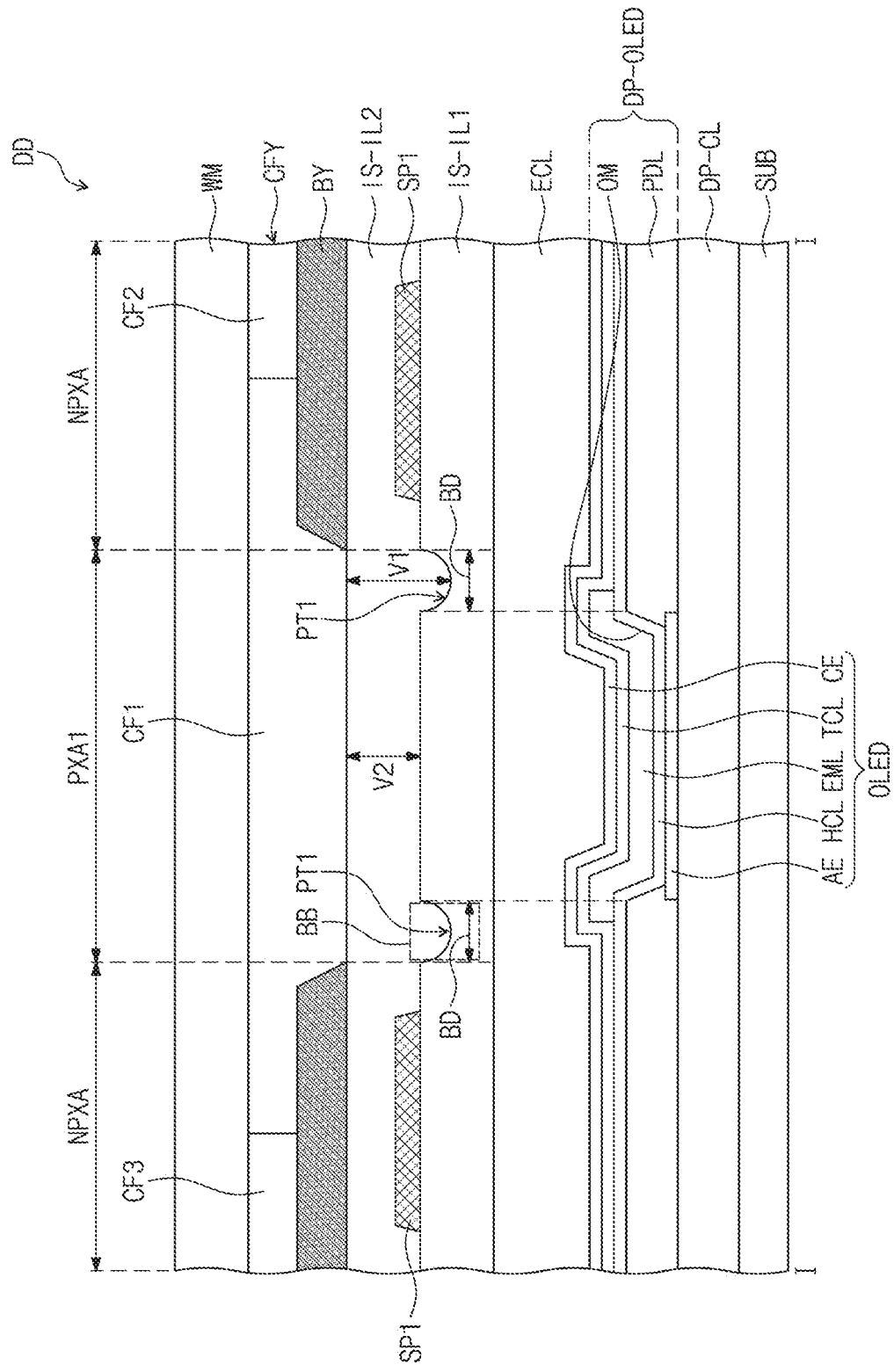

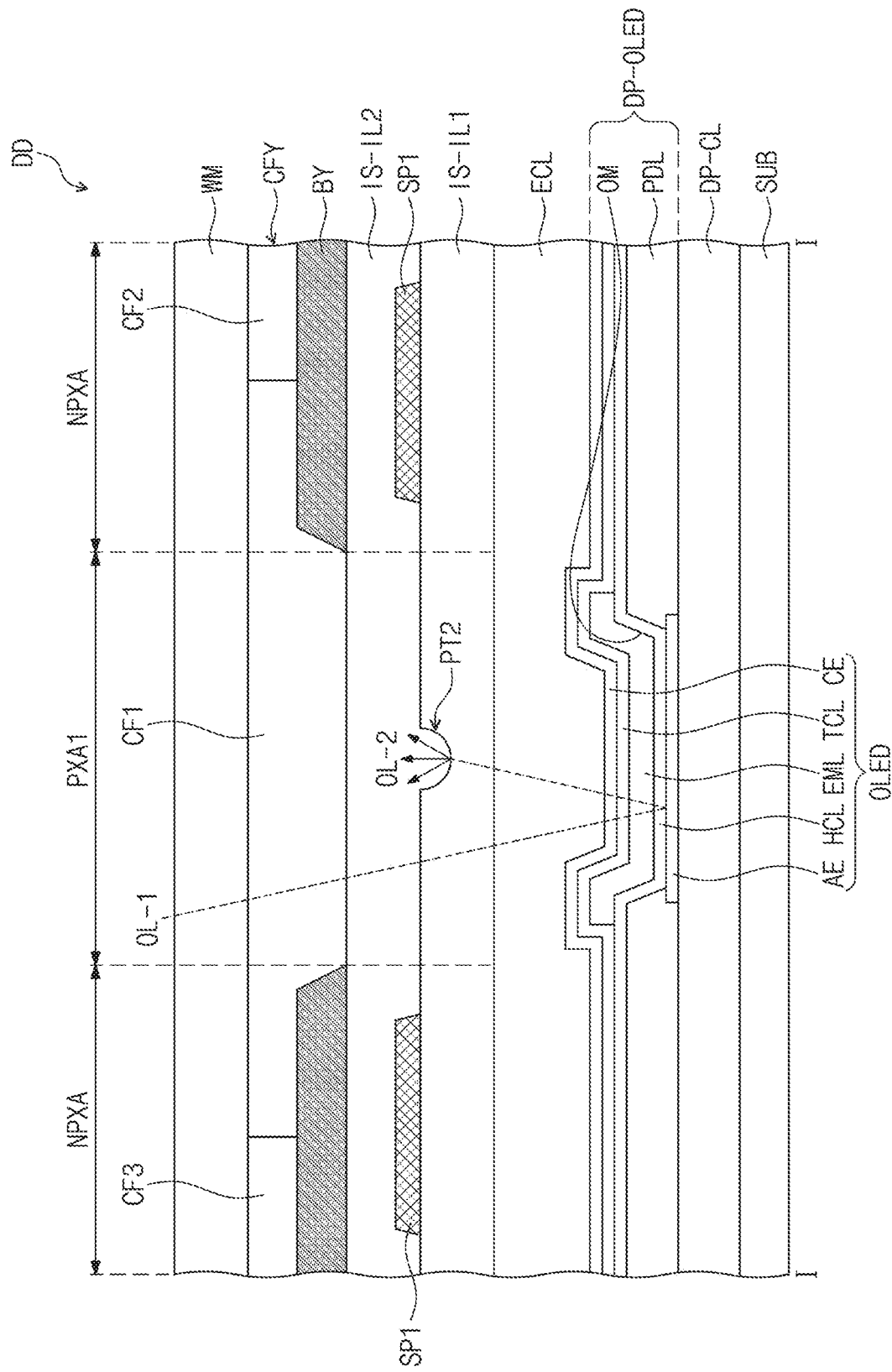

DISPLAY DEVICE INCORPORATING A SCATTERING PATTERN

CROSS-REFERENCE TO RELATED APPLICATION

This application claims priority from and the benefit of Korean Patent Application No. 10-2019-0019007, filed on Feb. 19, 2019, which is hereby incorporated by reference for all purposes as if fully set forth herein.

BACKGROUND

Field

Exemplary embodiments/implementations of the invention relate generally to a display device, and more specifically to the present disclosure relates to a display device having an input sensing unit and a display panel.

Discussion of the Background

Various display devices that are applied to multimedia devices, such as televisions, mobile phones, tablet computers, navigation devices, and game devices, have been developed. The display devices include a transmission type display panel that selectively transmits a source light generated by a light source and a light emission type display panel that generates the source light itself.

Meanwhile, when the display devices are used outdoors, reflection and scattering occur due to external light on a display surface where an image is viewed.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device capable of reducing an external light reflection and improving a visibility.

Additional features of the inventive concepts will be set forth in the description which follows, and in part will be apparent from the description, or may be learned by practice of the inventive concepts.

Embodiments of the inventive concepts provide a display device including a window including a plurality of pixel areas and a light shielding area defined adjacent to the pixel areas, a display panel including a base substrate, a pixel definition layer disposed on the base substrate and defining a plurality of openings respectively overlap the pixel areas, and a plurality of organic light emitting diodes respectively overlapping the openings and emitting a light through the openings, and an input sensing unit disposed between the window and the display panel. The input sensing unit includes a first conductive layer including a first conductive pattern disposed on the display panel, a first insulating layer covering the first conductive pattern, disposed on the display panel, and including a scattering pattern overlapping at least one pixel area among the pixel areas, a second conductive layer including a second conductive pattern disposed on an upper surface of the first insulating layer, and a second insulating layer covering the second conductive pattern and disposed on the upper surface the first insulating layer.

The scattering pattern may overlap the pixel definition layer and not overlap the light shielding area.

The one pixel area may have a lozenge shape when viewed in a plan view, and the scattering pattern may include a first scattering pattern and a second scattering pattern that respectively overlap two corners facing each other in one direction among corners of the lozenge shape.

The scattering pattern may further include a third scattering pattern and a fourth scattering pattern that respectively overlap the other two corners facing each other in another direction substantially perpendicular to the one direction among the corners of the lozenge shape.

The scattering pattern may include a plurality of sub-scattering patterns, and each of the sub-scattering pattern has a semi-circular shape when viewed in a cross section.

The scattering pattern may include a first inclination surface and a second inclination surface connected to the first inclination surface, and the first inclination surface and the second inclination surface are vertical to each other.

The first insulating layer may include a lower surface disposed on the display panel and the upper surface facing the lower surface, and the scattering pattern has a shape recessed downward from the upper surface of the first insulating layer toward the lower surface of the first insulating layer.

A thickness of the second insulating layer overlapping the scattering pattern may be greater than a thickness of the second insulating layer not overlapping the scattering pattern.

The scattering pattern may have a semi-circular shape when viewed in a cross section.

The scattering pattern may overlap an opening overlapping the one pixel area among the openings.

The scattering pattern may include a first scattering pattern and a second scattering pattern spaced apart from the first scattering pattern when viewed in a plan view.

The pixel areas may include first, second, and third pixel areas that emit different color lights from each other, and the scattering pattern overlapping the at least one pixel area is one of the first, second, and third pixel areas.

The display device may further include a color filter layer disposed between the window and the input sensing unit, and the color filter layer may include a first color filter overlapping the first pixel area and having a first color, a second color filter overlapping the second pixel area and having a second color, and a third color filter overlapping the third pixel area and having a third color.

The first color may be a red color, the second color may be a blue color, the third color may be a green color, and the scattering pattern may overlap the third color filter and does not overlap the first color filter and the second color filter.

The scattering pattern may further overlap another pixel area among the first, second, and third pixel areas.

The one pixel area may emit a red light, and the another pixel area may emit a blue light.

The first conductive pattern may include a first connection pattern, the second conductive pattern may include a first sensing pattern, a second connection pattern connecting the first sensing patterns, and a second sensing pattern electrically connected by the first connection pattern, and the first connection pattern and the second sensing pattern may be electrically connected to each other through a contact hole defined in the first insulating layer.

The first connection pattern may be directly disposed on the display panel, and the contact hole may be provided through the first insulating layer through a same process as the scattering pattern.

Embodiments of the inventive concepts provide a display device including a display panel including a base substrate, a pixel definition layer disposed on the base substrate and including openings defined therethrough, and a plurality of organic light emitting diodes respectively overlapping the openings and emitting a light through the openings, an input sensing unit including a first conductive pattern, a first insulating layer covering the first conductive pattern and disposed on the display panel, a second conductive pattern disposed on the first insulating layer, and a second insulating layer covering the second conductive pattern and disposed on the first insulating layer, and a light shielding layer disposed on the input sensing unit and surrounding the openings when viewed in a plan view. The first insulating layer includes a scattering pattern overlapping at least one pixel area among pixel areas.

The scattering pattern may overlap the pixel definition layer, not overlap a light shielding area, and have a shape recessed downward from an upper surface of the first insulating layer facing the second insulating layer toward a lower surface of the first insulating layer.

According to the above, the input sensing unit includes the insulating layer including the scattering pattern that overlaps the pixel area. That is, the external light reflected by the organic light emitting diode is scattered by the scattering pattern, and the intensity of the external light exiting through the scattering pattern may be reduced. As a result, the reflection of the external light may be prevented from concentrating in one area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7 is a cross-sectional view taken along a line I-I' illustrated in FIG. 6B to illustrate a display device according to an exemplary embodiment of the present disclosure;

FIG. 9 is a cross-sectional view taken along a line I-I' illustrated in FIG. 6B to illustrate a display device according to another exemplary embodiment of the present disclosure;

DETAILED DESCRIPTION

Figure 1A:
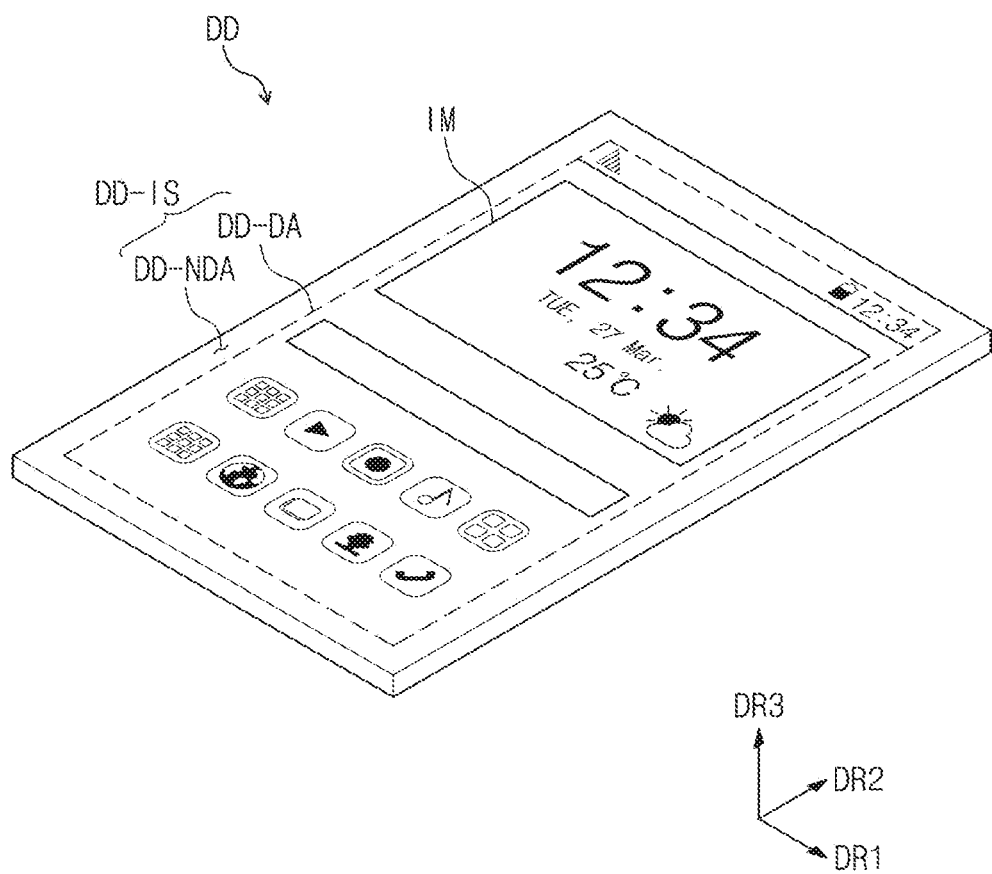
FIG. 1A is a perspective view illustrating a display device according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the present disclosure will be explained in detail with reference to the accompanying drawings.

Figure 1B:
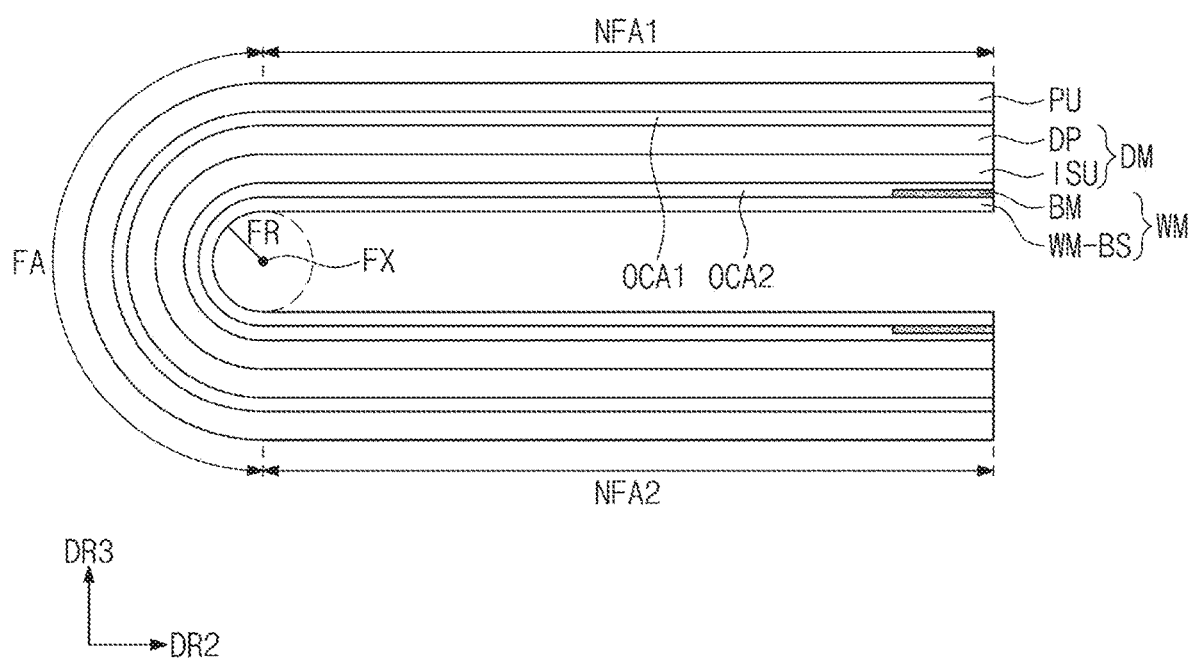
FIG. 1B is a cross-sectional view illustrating a display device according to an exemplary embodiment of the present disclosure.
Figure 2:
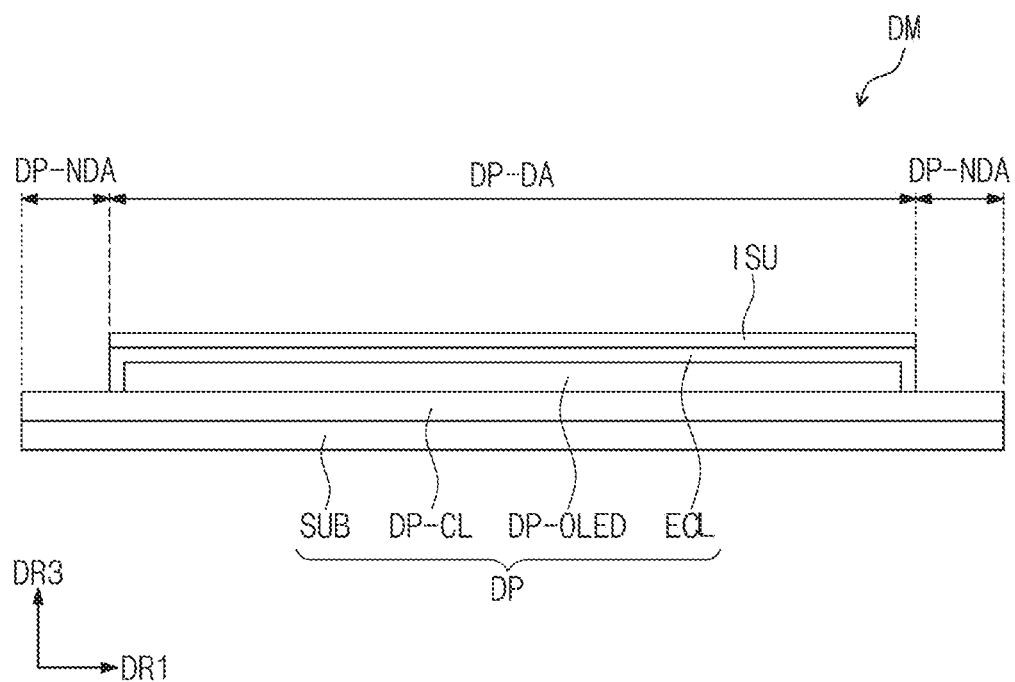
FIG. 2 is a cross-sectional view illustrating a display module according to an exemplary embodiment of the present disclosure.

FIG. 1A is a perspective view illustrating a display device according to an exemplary embodiment of the present disclosure. FIG. 1B is a cross-sectional view illustrating a display device according to an exemplary embodiment of the present disclosure. FIG. 2 is a cross-sectional view illustrating a display module according to an exemplary embodiment of the present disclosure.

Referring to FIG. 1A, the display device DD displays an image IM through a display surface DD-IS. FIG. 1A shows a clock display window and application icons as a representative example of the image IM. The display surface DD-IS includes a display area DD-DA through which the image IM is displayed and a non-display area DD-NDA disposed adjacent to the display area DD-DA. The image IM is not displayed through the non-display area DD-NDA.

As an example, the non-display area DD-NDA may surround the display area DD-DA. However, it should not be limited thereto or thereby, and the non-display area DD-NDA may be disposed adjacent to only one side of the display area DD-DA or may be omitted.

The display surface DD-IS may have a shape extending in a first direction DR1 and a second direction DR2 crossing the first direction DR1. A third direction DR3 indicates a normal line direction of the display surface DD-IS, i.e., a thickness direction of the display device DD. In the following descriptions, an expression "when viewed in a plan view", "in a plan view", or "area in a plan view" may mean a case of being viewed in the third direction DR3. Hereinafter, front (or upper) and rear (or lower) surfaces of each layer or each unit of the display device DD are distinct from each other by the third direction DR3. However, directions indicated by the first, second, and third directions DR1, DR2, and DR3 are relative to each other, and thus the directions indicated by the first, second, and third directions DR1, DR2, and DR3 may be changed to other directions, e.g., opposite directions.

According to the exemplary embodiment of the present disclosure, the display device DD will be described as having a quadrangular display surface DD-IS, however, it should not be limited thereto or thereby. For example, the display device DD may include a display surface having a partially curved shape in a plan view or a three-dimensional display surface. The three-dimensional display surface may include a plurality of display areas indicating different directions from each other, e.g., a polygonal columnar display surface.

According to an exemplary embodiment of the present disclosure, the display device DD may be a flexible display device. However, the display device DD should not be limited to the flexible display device, and the display device DD according to the present exemplary embodiment may be a rigid display device DD. In the present exemplary embodiment, the display device DD that may be applied to a mobile phone terminal is illustrated as a representative example. Although not illustrated in figures, electronic modules, a camera module, a power module, which are mounted on a main board, may be placed on a bracket/a case with the display device DD to form the mobile phone terminal. The display device DD according to the present disclosure may be applied to a large-sized electronic item, such as a television set and a monitor, and a small and medium-sized electronic item, such as a tablet computer, a car navigation unit, a game unit, and a smart watch.

Referring to FIG. 1B, the display device DD includes a display module DM, a window WM, and a protective layer PU. Each of the display module DM, the window WM, and the protective layer PU of the display device DD may have a flexibility.

The window WM is disposed on the display module DM. The window WM includes a base layer WM-BS and a black matrix BM. The black matrix BM is disposed on a lower surface of the base layer WM-BS to define a bezel area of the display device DD, i.e., the non-display area DD-NDA. The base layer WM-BS includes a glass substrate, a sapphire substrate, or a plastic film. The black matrix BM is a colored organic layer and is formed by a coating method. Meanwhile, an upper surface of a display panel DP corresponds to the display surface DD-IS. When an entire of the upper surface of the display panel DP is provided as the display surface DD-IS, the black matrix BM is omitted.

The display module DM is disposed between the window WM and the protective layer PU to display the image through the window WM or to sense an external input. The display module DM includes the display panel DP displaying the image and an input sensing unit ISU sensing the external input. The display panel DP is disposed on the protective layer PU, and the input sensing unit ISU is disposed between the window WM and the display panel DP.

The protective layer PU is disposed under the display module DM to support or protect the display module DM.

A first adhesive member OCA1 is disposed between the display module DM and the protective layer PU to couple the display module DM to the protective layer PU. In addition, a second adhesive member OCA2 is disposed between the window WM and the display module DM to couple the window WM to the display module DM. The first and second adhesive members OCA1 and OCA2 are provided as an optically transparent adhesive (OCA), however, they should not be limited thereto or thereby. The first and second adhesive members OCA1 and OCA2 may be provided as a pressure sensitive adhesive (PSA).

According to the exemplary embodiment of the present disclosure, the display device DD includes a folding area FA that is folded along a folding axis FX according to its operation and first and second non-folding areas NFA1 and NFA2 that are not folded. The folding axis FX may be the first direction DR1. The first non-folding area NFA1 and the second non-folding area NFA2 may be arranged with the folding area FA interposed therebetween. That is, the first non-folding area NFA1 extends from one end of the folding area FA, and the second non-folding area NFA2 extends from the other end of the folding area FA. According to the present disclosure, the display device DD may be folded in both directions with respect to the folding axis FX.

Referring to FIG. 2, the display module DM includes the display panel DP and the input sensing unit ISU.

The display panel DP according to the exemplary embodiment of the present disclosure may be a light emission type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP.

The display panel DP includes a base substrate SUB, a circuit element layer DP-CL, a display element layer DP-OLED, and an encapsulation layer ECL. The display panel DP includes a display area DP-DA and a non-display area DP-NDA. The display area DP-DA and the non-display area DP-NDA of the display panel DP may overlap the display area DD-DA and the non-display area DD-NDA of the display device DD described with reference to FIG. 1A. The non-display area DP-NDA may be disposed adjacent to one side of the display area DP-DA or may be omitted.

The base substrate SUB generally supports elements of the display panel DP and the input sensing unit ISU and includes a flexible material. As an example, the base substrate SUB includes a plastic substrate, a glass substrate, or an organic/inorganic composite substrate. As another example, the base substrate SUB may have a stack structure of a plurality of insulating layers. The plastic substrate includes at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

The circuit element layer DP-CL includes a plurality of insulating layers, a plurality of conductive layers, and a semiconductor layer. The conductive layers of the circuit element layer DP-CL form signal lines or a control circuit of pixels.

The display element layer DP-OLED overlaps the display area DP-DA and is disposed on the base substrate SUB. The display element layer DP-OLED includes a display element, e.g., organic light emitting diodes, however, it should not be limited thereto or thereby. The display element layer DP-OLED may include inorganic light emitting diodes or organic-inorganic hybrid light emitting diodes depending on the type of the display panel DP.

The encapsulation layer ECL encapsulates the display element layer DP-OLED. As an example, the encapsulation layer ECL overlaps each of the display area DP-DA and the non-display area DP-NDA or does not overlap the non-display area DP-NDA.

According to an exemplary embodiment, the encapsulation layer ECL may be provided as a thin film encapsulation layer and may include at least one insulating layer. The encapsulation layer ECL according to the exemplary embodiment of the present disclosure may include at least one encapsulation organic layer and at least one encapsulation inorganic layer.

The encapsulation inorganic layer protects the display element layer DP-OLED from moisture and oxygen, and the encapsulation organic layer protects the display element layer DP-OLED from foreign substance such as dust particles. The encapsulation inorganic layer includes a silicon nitride layer, a silicon oxynitride layer, a silicon oxide layer, a titanium oxide layer, or an aluminum oxide layer, however, it should not be particularly limited. The encapsulation organic layer includes an acrylic-based organic layer, however, it should not be limited thereto or thereby.

The input sensing unit ISU senses an input applied from the outside. The input applied from the outside is provided in various forms. For example, the external input includes various forms, such as a part of the user's body, a stylus pen, light, heat, or pressure. In addition to an input by contacting a part of user's body, such as a user's hand, a proximity or approaching space touch (e.g., hovering) may be a form of the external input.

According to the exemplary embodiment of the present disclosure, the input sensing unit ISU may be directly disposed on the display panel DP. In the present disclosure, the expression "component "A" is directly disposed on component "B"" means that no intervening elements, such as an adhesive layer, are present between the component "A" and the component "B". The input sensing unit ISU may be formed together with the display panel DP through successive processes. That is, the input sensing unit ISU may be directly formed on the encapsulation layer ECL through successive processes.

Figure 3A:
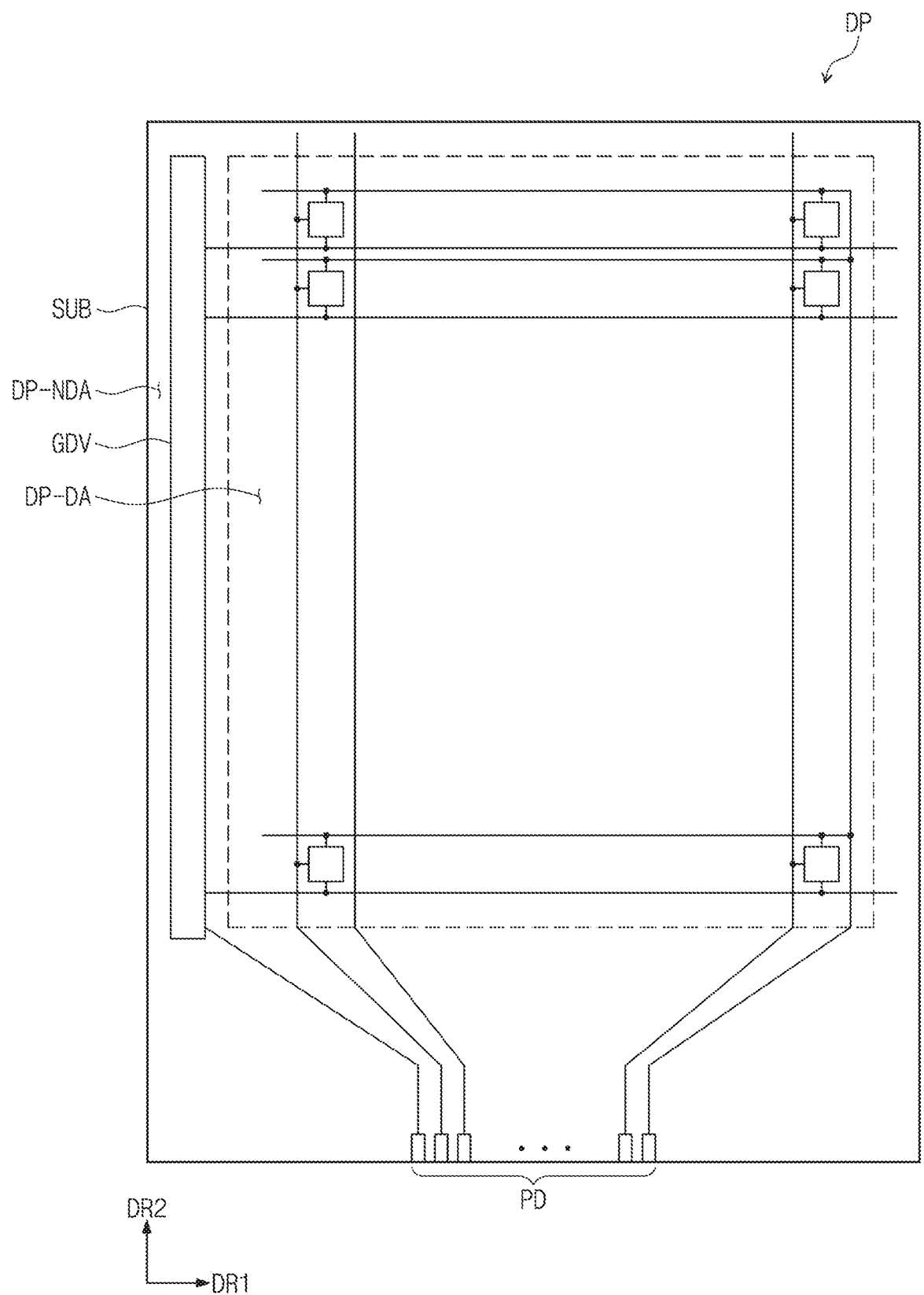
FIG. 3A is a plan view illustrating a display panel according to an exemplary embodiment of the present disclosure.
Figure 3B:
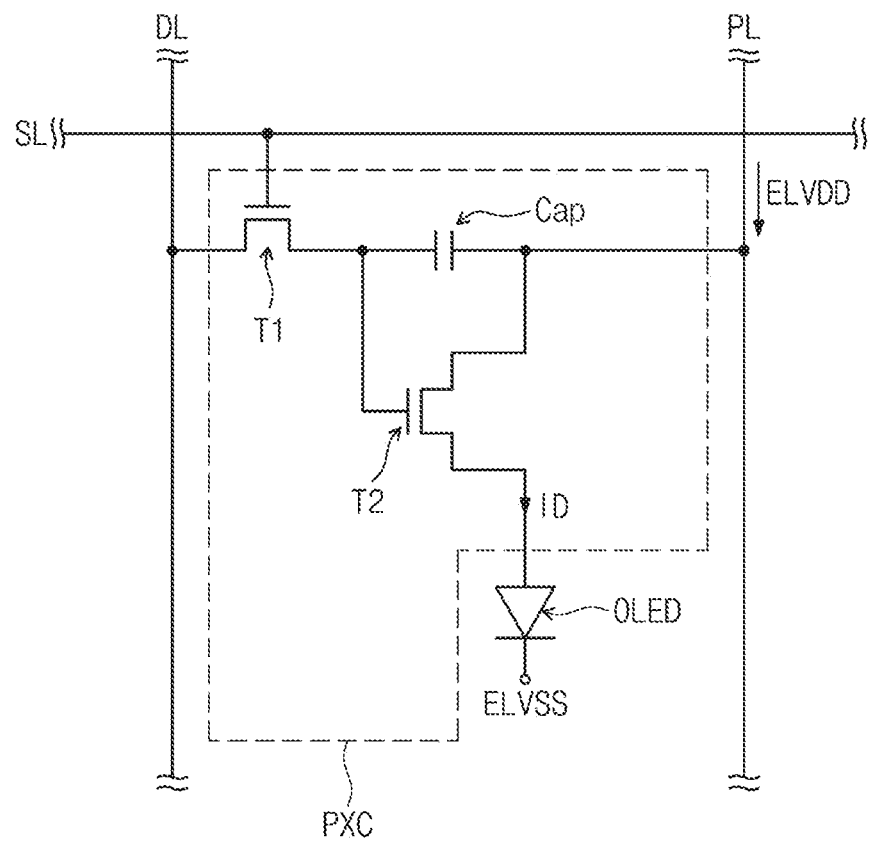
FIG. 3B is an equivalent circuit diagram illustrating a pixel according to an exemplary embodiment of the present disclosure.
Figure 3C:
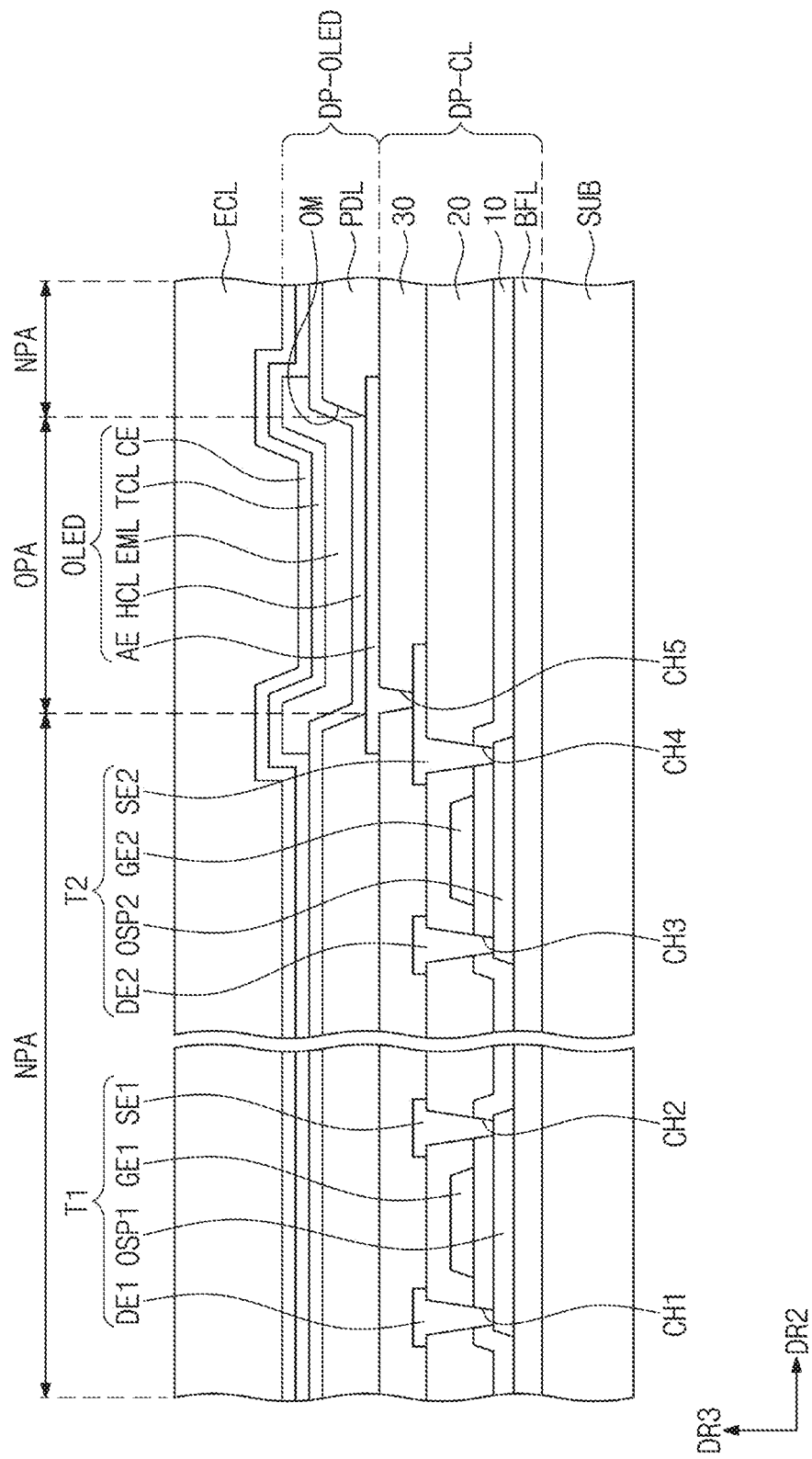
FIG. 3C is a cross-sectional view illustrating a portion of a display panel according to an exemplary embodiment of the present disclosure.

FIG. 3A is a plan view illustrating a display panel according to an exemplary embodiment of the present disclosure. FIG. 3B is an equivalent circuit diagram illustrating a pixel according to an exemplary embodiment of the present disclosure. FIG. 3C is a cross-sectional view illustrating a portion of a display panel according to an exemplary embodiment of the present disclosure.

Referring to FIGS. 3A and 3B, the display panel DP includes a scan driving circuit GDV, a plurality of signal lines SGL, a plurality of pixels PX, and a plurality of driving pads PD. An area in which the pixels PX are arranged is defined as the display area DP-DA.

The scan driving circuit GDV generates a plurality of scan signals and sequentially outputs the scan signals to the scan lines SL. The scan driving circuit GDV further outputs another control signal to a driving circuit of the pixels.

The signal lines SGL include scan lines SL, data lines DL, a power line PL, and a control signal line CSL.

Each of the scan lines SL is connected to a corresponding pixel among the pixels PX, and each of the data lines DL is connected to a corresponding pixel among the pixels PX. The power line PL is connected to the pixels PX. In addition, the scan driving circuit GDV connected to the scan lines SL is disposed in the non-display area DP-NDA. The control signal line CSL provides the scan driving circuit with control signals.

Some of the scan lines SL, the data lines DL, the power line, and the control signal line CSL are disposed on the same layer, and some of the scan lines SL, the data lines DL, the power line, and the control signal line CSL are disposed on the different layers. When signal lines disposed on one layer among the scan lines SL, the data lines DL, the power line, and the control signal line CSL are defined as first signal lines, signal lines disposed on another layer among the scan lines SL, the data lines DL, the power line, and the control signal line CSL are defined as second signal lines. Signal lines disposed on the other layer among the scan lines SL, the data lines DL, the power line, and the control signal line CSL are defined as third signal lines.

The display panel DP includes a plurality of driving pads PD electrically connected to the data lines DL, the power line, and the control signal line CSL. The driving pads PD overlap the non-display area DP-NDA.

FIG. 3B illustrates a pixel PX connected to one scan line SL, one data line DL, and the power line PL as a representative example. However, the present disclosure should not be limited to a circuit configuration of FIG. 3B, and the circuit configuration of the pixel PX may be changed in various ways.

The pixel PX includes an organic light emitting diode OLED and a pixel driving circuit PXC. The organic light emitting diode OLED is included in the display element layer DP-OLED illustrated in FIG. 2. The organic light emitting diode OLED may be a front surface light-emitting type diode or a rear surface light-emitting type diode.

The pixel driving circuit PXC is a circuit to drive the organic light emitting diode OLED and includes a first transistor T1 (or referred to as "switching transistor"), a second transistor T2 (or referred to as "driving transistor"), and a capacitor Cap. The pixel driving circuit PXC is included in the circuit element layer DP-CL illustrated in FIG. 2.

The organic light emitting diode OLED generates a light in response to electrical signals applied thereto from the first and second transistors T1 and T2.

The first transistor T1 outputs a data signal applied to the data line DL in response to a scan signal applied to the scan line SL. The capacitor Cap is charged with a voltage corresponding to the data signal provided from the first transistor T1. A first power source voltage ELVDD is applied to a first electrode AE through the second transistor T2, and a second power source voltage ELVSS is applied to a second electrode CE. The second power source voltage ELVSS may be lower than the first power source voltage ELVDD.

The second transistor T2 is electrically connected to the organic light emitting diode OLED through the first electrode AE. The second transistor T2 controls a driving current ID flowing through the organic light emitting diode OLED depending on an amount of electric charges charged in the capacitor Cap. The organic light emitting diode OLED emits the light during a turn-on period of the second transistor T2.

FIG. 3C illustrates a cross-section of a portion of the display panel DP corresponding to the equivalent circuit illustrated in FIG. 3B. The circuit element layer DP-CL, the display element layer DP-OLED, and the encapsulation layer ECL are sequentially disposed on the base substrate SUB.

The circuit element layer DP-CL includes at least one insulating layer and a circuit element. The circuit element includes the signal lines and the driving circuit of the pixel. The circuit element layer DP-CL may be formed by coating and deposition processes used to form an insulating layer, a semiconductor layer, and a conductive layer and a photolithography process used to pattern the insulating layer, the semiconductor layer, and the conductive layer.

The circuit element layer DP-CL includes a buffer layer BFL, a first intermediate inorganic layer 10, and a second intermediate inorganic layer 20, each of which is an inorganic layer. In addition, the circuit element layer DP-CL includes an intermediate organic layer 30. The buffer layer BFL includes a plurality of inorganic layers stacked one on another. FIG. 3C illustrates an arrangement of a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which form the switching driving transistor T1 and the driving transistor T2, as a representative example. First to fourth through holes CH1 to CH4 are also illustrated by way of example.

The display element layer DP-OLED includes the organic light emitting diode OLED and a pixel definition layer PDL. The organic light emitting diode OLED includes the first electrode AE, a hole control layer HCL, a light emitting layer EML, an electron control layer TCL, and the second electrode CE. The pixel definition layer PDL is an organic layer and is provided with an opening OM defined therethrough. At least a portion of the first electrode AE is exposed through the opening OM of the pixel definition layer PDL.

In detail, the first electrode AE is disposed on the intermediate organic layer 30 (hereinafter, referred to as "planarization layer"). The first electrode AE is connected to the second output electrode SE2 through a fifth through hole CH5 defined through the planarization layer 30.

The display area DP-DA of the display panel DP includes a light emitting area OPA and a non-light emitting area NPA defined adjacent to the light emitting area OPA. The display element layer DP-OLED overlapping the display area DP-DA includes a plurality of light emitting areas OPA and the non-light emitting area NPA defined adjacent to the light emitting areas. As an example, the non-light emitting area NPA surrounds the light emitting area OPA.

According to the present disclosure, the pixel definition layer PDL includes a plurality of openings OM, and the light emitting areas OPA are respectively defined by the openings OM. That is, the light emitting area OPA is defined corresponding to a portion of the first electrode AE exposed through the opening OM.

The hole control layer HCL may be commonly disposed on the light emitting area OPA and the non-light emitting area NPA. The hole control layer HCL may include a hole transport layer and may further include a hole injection layer. The light emitting layer EML may be disposed on the hole control layer HCL. The light emitting layer EML may be disposed in an area corresponding to the opening OM. That is, the light emitting layer EML may be formed in each of the pixels after being divided into plural portions. The light emitting layer EML may include an organic material and/or an inorganic material. The light emitting layer EML may generate a predetermined color light.

The electron control layer TCL may be disposed on the light emitting layer EML. The electron control layer TCL may include an electron transport layer and may further include an electron injection layer. The hole control layer HCL and the electron control layer TCL may be commonly formed in plural pixels using an open mask. The second electrode CE may be disposed on the electron control layer TCL. The second electrode CE may have an integral shape and may be commonly disposed in the electron control layer TCL included in each pixel.

The encapsulation layer ECL may be disposed on the second electrode CE. The encapsulation layer ECL may be provided by a single encapsulation layer or by a plurality of thin films.

Figure 3D:
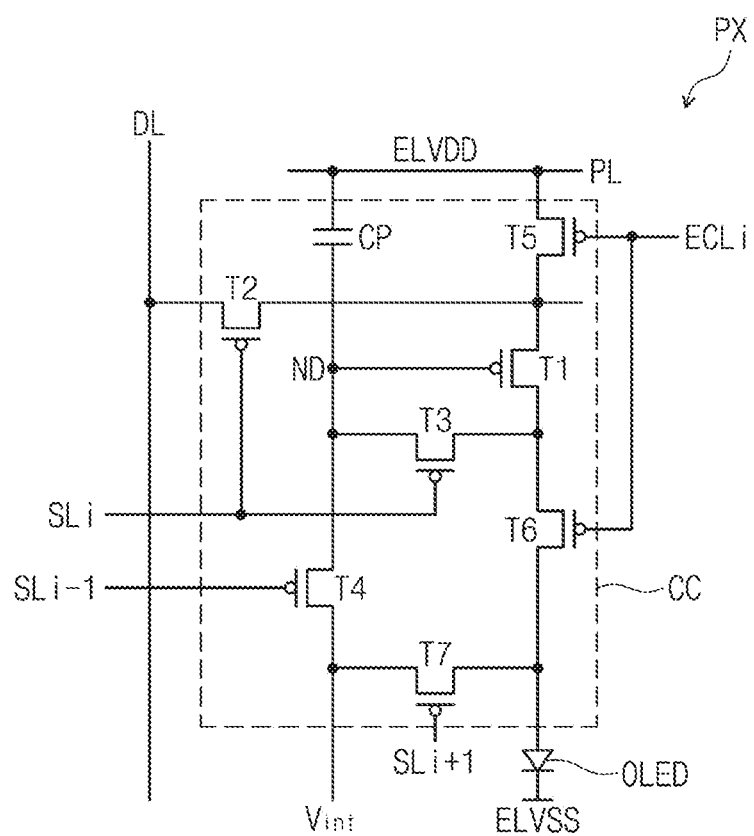
FIG. 3D is an equivalent circuit diagram illustrating a pixel according to another exemplary embodiment of the present disclosure.

FIG. 3D is an equivalent circuit diagram illustrating a pixel PX according to another exemplary embodiment of the present disclosure.

The pixel PX may include an organic light emitting diode OLED and a pixel circuit CC. The pixel circuit CC may include a plurality of transistors T1 to T7 and a capacitor CP. The pixel circuit CC may control an amount of current flowing through the organic light emitting diode OLED in response to a data signal.

The organic light emitting diode OLED may emit a light at a predetermined luminance in response to the amount of current provided from the pixel circuit CC. To this end, a level of a first power source voltage ELVDD may be set higher than a level of a second power source voltage ELVSS.

Each of the transistors T1 to T7 may include an input electrode (or source electrode), an output electrode (or drain electrode), and a control electrode (or gate electrode). In the following descriptions, for the convenience of explanation, one electrode of the input electrode and the output electrode may be referred to as a "first electrode", and the other electrode of the input electrode and the output electrode may be referred to as a "second electrode".

A first electrode of a first transistor T1 is connected to the first power source voltage ELVDD via a fifth transistor T5, and a second electrode of the first transistor T1 is connected to an anode electrode of the organic light emitting diode OLED via a sixth transistor T6. The first transistor T1 may be referred to as a "driving transistor" in the present disclosure.

The first transistor T1 controls the amount of current flowing through the organic light emitting diode OLED in response to a voltage applied to a control electrode of the first transistor T1.

A second transistor T2 is connected between the data line DL and the first electrode of the first transistor T1. A control electrode of the second transistor T2 is connected to an i-th scan line SLi. The second transistor T2 is turned on when an i-th scan signal Si is applied to the i-th scan line SLi and electrically connects the data line DL to the first electrode of the first transistor T1.

A third transistor T3 is connected between the second electrode of the first transistor T1 and the control electrode of the first transistor T1. A control electrode of the third transistor T3 is connected to the i-th scan line SLi. The third transistor T3 is turned on when the i-th scan signal Si is applied to the i-th scan line SLi and electrically connects the second electrode of the first transistor T1 to the control electrode of the first transistor T1. Accordingly, when the third transistor T3 is turned on, the first transistor T1 is connected in a diode configuration.

A fourth transistor T4 is connected between a node ND and an initialization power generator (not illustrated). A control electrode of the fourth transistor T4 is connected to an (i−1)th scan line SLi−1. The fourth transistor T4 is turned on when an (i−1)th scan signal Si−1 is applied to the (i−1)th scan line SLi−1 and provides an initialization voltage Vint to the node ND.

The fifth transistor T5 is connected between a power line PL and the first electrode of the first transistor T1. A control electrode of the fifth transistor T5 is connected to an i-th light emitting control line ECLi.

The sixth transistor T6 is connected between the second electrode of the first transistor T1 and the anode electrode of the organic light emitting diode OLED. A control electrode of the sixth transistor T6 is connected to the i-th light emitting control line ECLi.

A seventh transistor T7 is connected between the initialization power generator (not illustrated) and the anode electrode of the organic light emitting diode OLED. A control electrode of the seventh transistor T7 is connected to an (i+1)th scan line SLi+1. The seventh transistor T7 is turned on when an (i+1)th scan signal Si+1 is applied to the (i+1)th scan line SLi+1 and provides the initialization voltage Vint to the anode electrode of the organic light emitting diode OLED.

The seventh transistor T7 may improve a black expression ability of the pixel PX. In detail, when the seventh transistor T7 is turned on, a parasitic capacitance (not illustrated) of the organic light emitting diode OLED is discharged. Accordingly, when implementing a black luminance, the organic light emitting diode OLED does not emit the light due to a leakage current from the first transistor T1, and thus the black expression ability may be improved.

Additionally, in FIG. 3D, the control electrode of the seventh transistor T7 is connected to the (i+1)th scan line SLi+1, however, it should not be limited thereto or thereby. According to another embodiment, the control electrode of the seventh transistor T7 may be connected to the i-th scan line SLi or the (i−1)th scan line SLi−1.

FIG. 3D illustrates a PMOS as a reference of the pixel PX, however, it should not be limited thereto or thereby. According to another embodiment, the pixel PX may be implemented by an NMOS. According to another embodiment, the pixel PX may be implemented by a combination of the NMOS and the PMOS.

The capacitor CP is disposed between the power line PL and the node ND. The capacitor CP is charged with a voltage corresponding to the data signal. When the fifth and sixth transistors T5 and T6 are turned on due to the voltage charged in the capacitor CP, the amount of the current flowing through the first transistor T1 may be determined.

In the present disclosure, the structure of the pixel PX should not be limited to the structure illustrated in FIG. 3D. According to another embodiment of the present disclosure, the pixel PX may be implemented in various ways to allow the organic light emitting diode OLED to emit the light.

Figure 4:
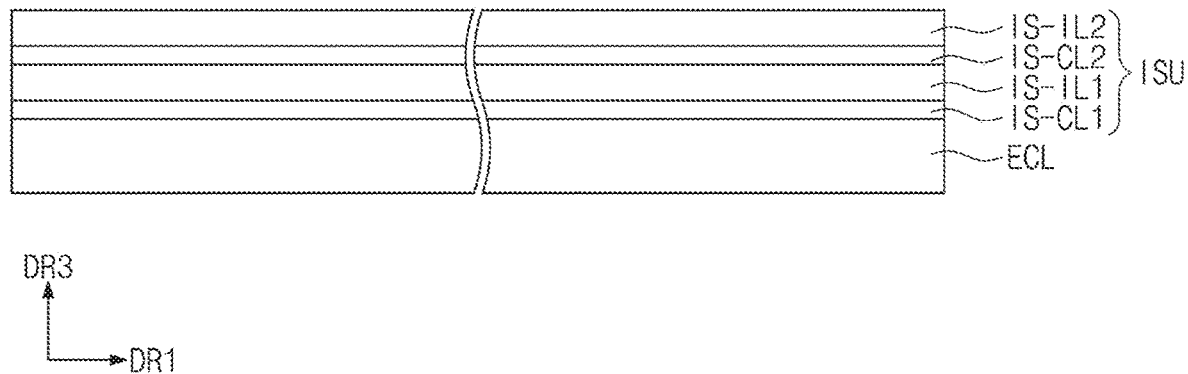
FIG. 4 is a cross-sectional view illustrating an input sensing unit according to an exemplary embodiment of the present disclosure.
Figure 5:
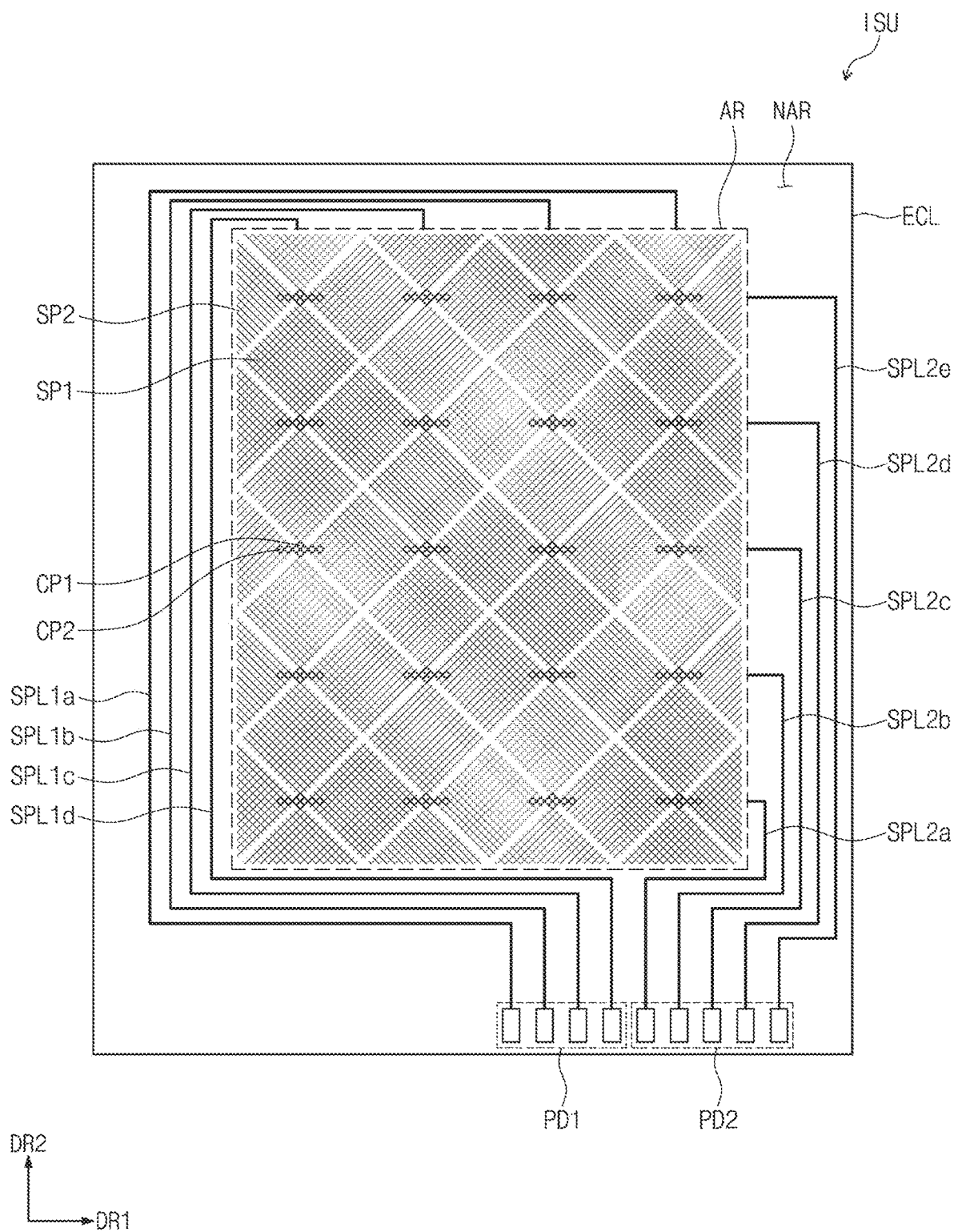
FIG. 5 is a plan view illustrating an input sensing unit according to an exemplary embodiment of the present disclosure.

FIG. 4 is a cross-sectional view illustrating an input sensing unit ISU according to an exemplary embodiment of the present disclosure. FIG. 5 is a plan view illustrating an input sensing unit ISU according to an exemplary embodiment of the present disclosure.

Referring to FIG. 4, the input sensing unit ISU includes a first conductive layer IS-CL1, a first insulating layer IS-IL1, a second conductive layer IS-CL2, and a second insulating layer IS-IL2. The first conductive layer IS-CL1 may be directly disposed on the encapsulation layer ECL.

Each of the first conductive layer IS-CL1 and the second conductive layer IS-CL2 may have a single-layer structure or a multi-layer structure of layers stacked in the third direction DR3. The conductive layer having the multi-layer structure may include at least two layers among transparent conductive layers and metal layers. The conductive layer having the multi-layer structure may include metal layers including metals different from each other. The transparent conductive layer may include indium tin oxide (ITO), indium zinc oxide (IZO), zinc oxide (ZnO), indium tin zinc oxide (ITZO), PEDOT, a metal nanowire, or a graphene. The metal layer may include molybdenum, silver, titanium, copper, aluminum, or alloys thereof. For instance, each of the first conductive layer IS-CL1 and the second conductive layer IS-CL2 may have a three-layer structure of titanium/aluminum/titanium.

Each of the first conductive layer IS-CL1 and the second conductive layer IS-CL2 includes a plurality of conductive patterns. Hereinafter, the first conductive layer IS-CL1 will be described as including first conductive patterns, and the second conductive layer IS-CL2 will be described as including second conductive patterns. According to the present disclosure, the conductive patterns disposed on the same layer may be formed through the same process, may include the same material, and may have the same stack structure.

For instance, the first conductive patterns may include a first connection pattern, and the second conductive patterns may include sensing patterns, sensing signal lines connected to the sensing patterns, and a second connection pattern. The sensing patterns may overlap the non-light emitting area NPA illustrated in FIG. 3C and may have a mesh shape that does not overlap the light emitting area OPA. In addition, the sensing patterns may overlap the light emitting area OPA and the non-light emitting area NPA and may be transparent.

Each of the first insulating layer IS-IL1 and the second insulating layer IS-IL2 may include an inorganic material or an organic material. According to the exemplary embodiment of the present disclosure, the first insulating layer IS-IL1 and the second insulating layer IS-IL2 may be an organic layer containing an organic material. The organic layer may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

However, the first insulating layer IS-IL1 and the second insulating layer IS-IL2 may be an inorganic layer containing an inorganic material. The inorganic layer may include at least one of aluminum oxide, titanium oxide, silicon oxide, silicon oxynitride, zirconium oxide, and hafnium oxide.

According to the exemplary embodiment of the present disclosure, the input sensing unit ISU may sense the external input by a capacitive sensing method. For example, the input sensing unit ISU may calculate coordinate information on the external input based on a variation in capacitance between the second conductive patterns included in the second conductive layer IS-CL2.

Referring to FIG. 5, the input sensing unit ISU includes a plurality of first sensor units, a plurality of second sensor units, a plurality of sensing signal lines, a first pad unit PD1, and a second pad unit PD2.

The input sensing unit ISU includes an active area AR and a non-active area NAR defined adjacent to the active area AR. The active area AR corresponds to the display area DP-DA illustrated in FIG. 3A, and the non-active area NAR corresponds to the non-display area DP-NDA illustrated in FIG. 3A. In addition, the input sensing unit ISU according to the present disclosure is directly disposed on the encapsulation layer ECL.

The first sensor units and the second sensor units are arranged in the active area AR. The sensing signal lines, the first pad unit PD1, and the second pad unit PD2 are arranged in the non-active area NAR.

The first sensor units are arranged in the first direction DR1 and have a shape extending in the second direction DR2. Each of the first sensor units includes a plurality of first sensing patterns SP1 and a plurality of first connection patterns CP1 connecting the first sensing patterns SP1.

Each of the first sensing patterns SP1 and the first connection patterns CP1 have a mesh shape through which a plurality of mesh openings is defined. The first sensing patterns SP1 and the first connection patterns CP1 are arranged in the second direction DR2. Each of the first connection patterns CP1 connects two first sensing patterns SP1 adjacent to each other among the first sensing patterns SP1.

The second sensor units are arranged in the second direction DR2 and have a shape extending in the first direction DR1. Each of the second sensor units includes a plurality of second sensing patterns SP2 and a plurality of second connection patterns CP2 connecting the second sensing patterns SP2.

Each of the second sensing patterns SP2 and the second connection patterns CP2 have a mesh shape through which a plurality of mesh openings is defined. The second sensing patterns SP2 and the second connection patterns CP2 are arranged in the first direction DR1. Each of the second connection patterns CP2 connects two second sensing patterns SP2 adjacent to each other among the second sensing patterns SP2.

As an example, the second connection patterns CP2 are disposed on a layer different from a layer on which the second sensing patterns SP2 are disposed. That is, at least one insulating layer is disposed between the second connection patterns CP2 and the second sensing patterns SP2. In addition, the second connection patterns CP2 are respectively and electrically connected to the second sensing patterns SP2 through contact holes defined through the insulating layer.

Meanwhile, according to the present disclosure, the second connection pattern CP2 are included in the first conductive layer IS-CL1 and will be described as first conductive patterns. The first sensing patterns SP1, the second sensing patterns SP2, and the second connection patterns CP2 are included in the second conductive layer IS-CL2 and will be described as second conductive patterns, however, they should not be limited thereto or thereby. That is, positions of the first conductive layer IS-CL1 and the second conductive layer IS-CL2 may be changed with respect to each other.

The sensing signal lines include first sensing signal lines SPL1a to SPL1d and second sensing signal lines SPL2a to SPL2e. One ends of the first sensing signal lines SPL1a to SPL1d are connected to the first sensing patterns SP1, and the other ends of the first sensing signal lines SPL1a to SPL1d are respectively connected to pads included in the first pad unit PD1. The first sensing signal lines SPL1a to SPL1d transmit sensing signals output from the first pad unit PD1 to the first sensing patterns SP1.

One ends of the second sensing signal lines SPL2a to SPL2e are connected to the second sensing patterns SP2, and the other ends of the second sensing signal lines SPL2a to SPL2e are respectively connected to pads included in the second pad unit PD2. The second sensing signal lines SPL2a to SPL2e transmit electrical signals output from the second pad unit PD2 to the second sensing patterns SP2.

Although not illustrated in figures, the first sensing signal lines SPL1a to SPL1d and the second sensing signal lines SPL2a to SPL2e may have a mesh shape.

Figure 6A:
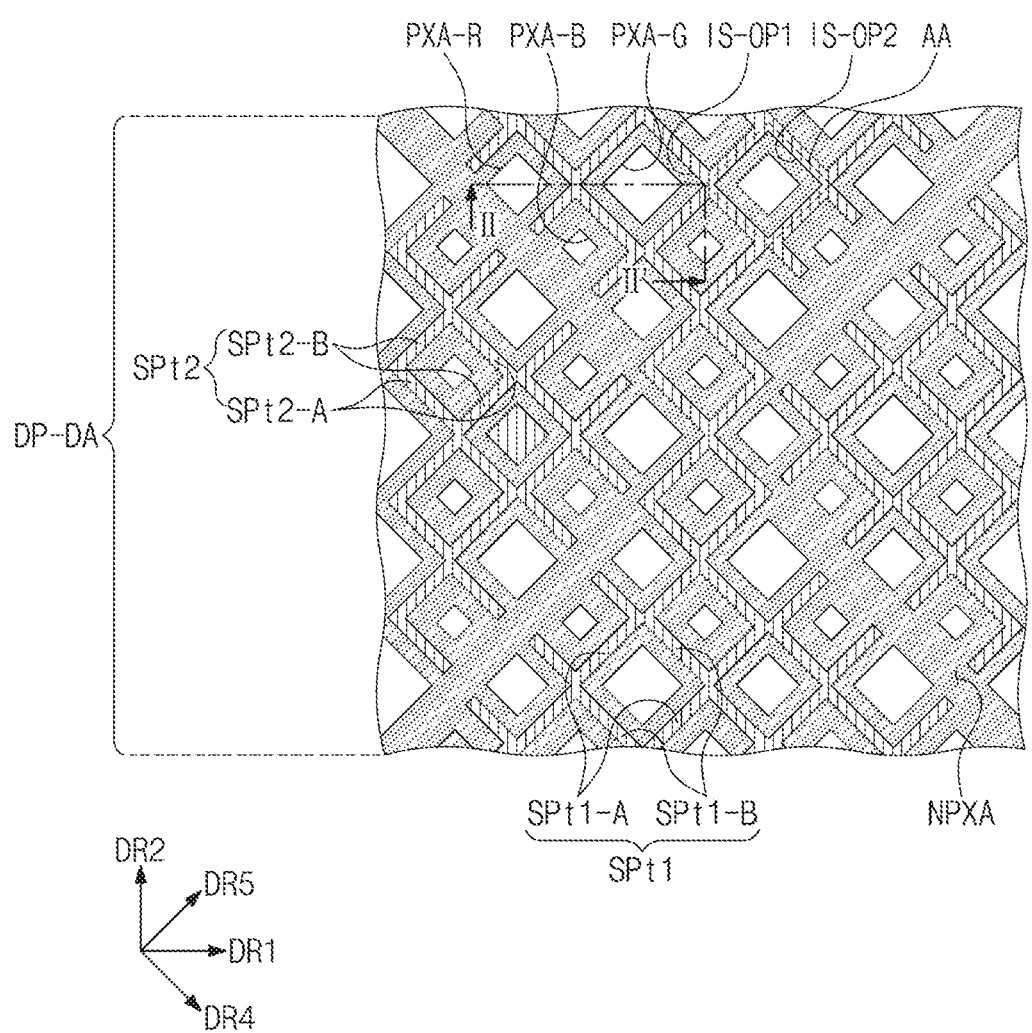
FIG. 6A is an enlarged view illustrating a portion illustrated in FIG. 5 according to an exemplary embodiment of the present disclosure.
Figure 6B:
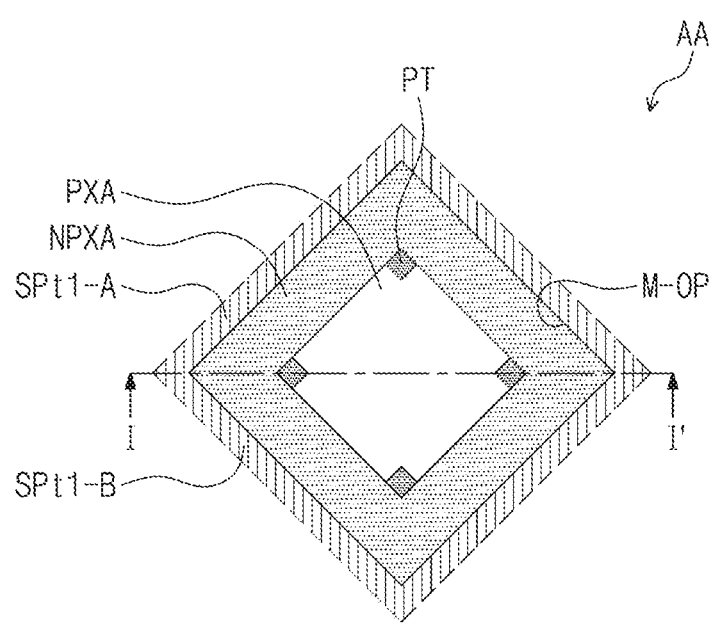
FIG. 6B is an enlarged view illustrating an area AA illustrated in FIG. 6A.

FIG. 6A is an enlarged view illustrating a portion illustrated in FIG. 5 according to an exemplary embodiment of the present disclosure. FIG. 6B is an enlarged view illustrating an area AA illustrated in FIG. 6A.

Referring to FIG. 6A, the display area DP-DA includes a plurality of pixel areas PXA-R, PXA-G, and PXA-B and a light shielding area NPXA defined adjacent to the pixel areas PXA-R, PXA-G, and PXA-B. As an example, the light shielding area NPXA surrounds the pixel areas PXA-R, PXA-G, and PXA-B. In addition, the pixel areas PXA-R, PXA-G, and PXA-B respectively overlap the light emitting areas OPA, i.e., the openings included in the pixel definition layer PDL, which are described with reference to FIG. 3C. In the present disclosure, the pixel area means an area from which the light exits to the outside through the display surface DD-IS described with reference to FIG. 1A.

The first sensing patterns SP1 (refer to FIG. 5) include first mesh lines SPt1 defining mesh openings. In the present disclosure, the first mesh lines SPt1 define the mesh openings, however, at least some of the first mesh lines SPt1 may not define the mesh openings. For example, some of the first mesh lines SPt1 disposed adjacent to an edge of the first sensing pattern SP1 may not define the mesh opening.

The second sensing patterns SP2 (refer to FIG. 5) include second mesh lines SPt2 defining mesh openings. Similarly, in the present disclosure, the second mesh lines SPt2 define the mesh openings, however, at least some of the second mesh lines SPt2 may not define the mesh openings. For example, some of the second mesh lines SPt2 disposed adjacent to an edge of the second sensing pattern SP2 may not define the mesh opening.

According to the exemplary embodiment of the present disclosure, an area of the mesh opening may be greater than an area of the pixel area when viewed in a plan view.

In addition, each of the first mesh lines SPt1 and the second mesh lines SPt2 overlap the light shielding area NPXA. Each of the first mesh lines SPt1 includes two first extension portions SPt1-A extending in a fifth direction DR5 crossing the first direction DR1 and the second direction DR2 and two second extension portions SPt1-B extending in a fourth direction DR4 crossing the fifth direction DR5. The first extension portions SPt1-A face each other and are connected to the second extension portions SPt1-B. The second extension portions SPt1-B face each other and are connected to the first extension portions SPt1-A. The mesh lines have a line width of a few micrometers.

Each of the second mesh lines SPt2 includes two third extension portions SPt2-A extending in the fourth direction DR4 crossing the first direction DR1 and the second direction DR2 and two fourth extension portions SPt2-B extending in the fifth direction DR5 crossing the fourth direction DR4. The third extension portions SPt2-A face each other and are connected to the fourth extension portions SPt2-B. The fourth extension portions SPt2-B face each other and are connected to the third extension portions SPt2-A. The mesh lines have a line width of a few micrometers.

Meanwhile, the light generated by the organic light emitting diode OLED illustrated in FIG. 3C may exit to the outside through the pixel area PXA. However, the external light may be incident to the organic light emitting diode OLED through the pixel area PXA. In this case, the external light incident to the organic light emitting diode OLED is reflected by the first electrode AE of the organic light emitting diode OLED and exits to the outside through the pixel area PXA.

FIG. 6B illustrates one mesh opening M-OP among the mesh openings illustrated in FIG. 6A.

Referring to FIG. 6B, the mesh opening M-OP according to the present disclosure may have a lozenge shape when viewed in a plan view. Similarly, the pixel area PXA surrounded by the light shielding area NPXA when viewed in a plan view may have the lozenge shape. However, the shape of the mesh opening M-OP and the pixel area PXA should not be limited to the lozenge shape and may be changed in various ways.

The display device DD according to the present disclosure may include a scattering pattern PT overlapped with corners of the pixel area PXA having the lozenge shape. The scattering pattern PT may scatter the light incident thereto. In particular, the scattering pattern PT may be included in the first insulating layer IS-IL1 illustrated in FIG. 4. When the external light reflected by the first electrode AE of the organic light emitting diode OLED is transmitted to the scattering pattern PT of the first insulating layer IS-IL1, the external light may be scattered by the scattering pattern PT. As a result, an intensity of the external light reflected again to the outside through the pixel area PXA may be prevented from concentrating in one area. This will be described in detail with reference to FIG. 7.

Figure 8A:
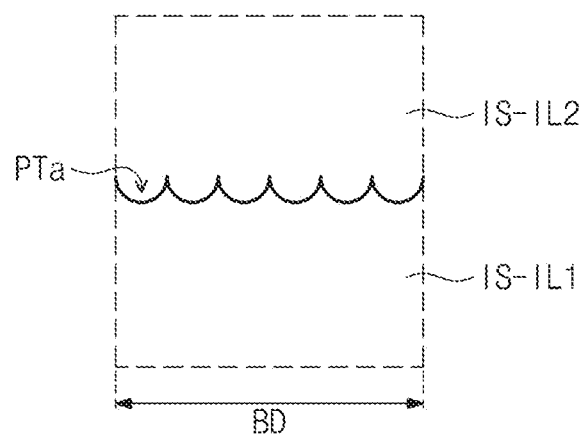
FIG. 8A is an enlarged view illustrating an example of an area BB illustrated in FIG. 7.
Figure 8B:
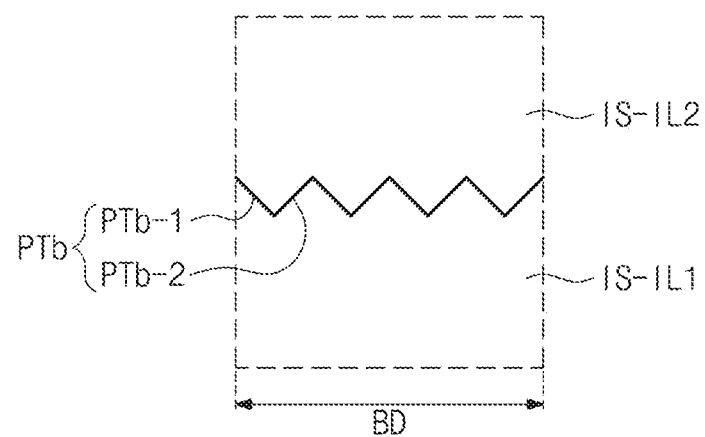
FIG. 8B is an enlarged view illustrating another example of the area BB illustrated in FIG. 7.

FIG. 7 is a cross-sectional view taken along a line I-I' illustrated in FIG. 6B to illustrate a display device according to an exemplary embodiment of the present disclosure. FIG. 8A is an enlarged view illustrating an example of an area BB illustrated in FIG. 7. FIG. 8B is an enlarged view illustrating another example of the area BB illustrated in FIG. 7.

Referring to FIG. 7, the display device DD further includes a color filter layer CFY and a light shielding layer BY in addition to the components described with reference to FIG. 1B. The color filter layer CFY is disposed between the window WM and the input sensing unit ISU and includes first, second, and third color filters CF1, CF2, and CF3.

The first color filter CF1 has a first color and overlaps a first pixel area among the pixel areas PXA. The second color filter CF2 has a second color and overlaps a second pixel area among the pixel areas PXA. The third color filter CF3 has a third color and overlaps a third pixel area among the pixel areas PXA. For instance, the first color is a red color, the second color is a blue color, and the third color is a green color.

The light shielding layer BY is disposed on the second insulating layer IS-IL2 of the input sensing unit ISU. The light shielding layer BY includes an opening defined therethrough to correspond to the pixel area PXA. That is, the pixel area PXA is defined by the opening defined through the light shielding layer BY, and the light shielding area NPXA is defined as an area overlapping the light shielding layer BY. As an example, the light shielding layer BY has a black color and partitions the first, second, and third color filters CF1, CF2, and CF3.

Hereinafter, in the present disclosure, the window WM will be described as including the pixel areas PXA defined by the openings defined through the light shielding layer BY and the light shielding area NPXA overlapping the light shielding layer BY.

Meanwhile, the base substrate SUB, the circuit element layer DP-CL, the display element layer DP-OLED, and the encapsulation layer ECL of the display panel DP illustrated in FIG. 7 may have substantially the same structure as those illustrated in FIG. 3C, and thus, details thereof will be omitted.

The input sensing unit ISU described with reference to FIG. 4 includes the first conductive layer IS-CL1, the first insulating layer IS-IL1, the second conductive layer IS-CL2, and the second insulating layer IS-IL2. Although not illustrated in FIG. 7, the second connection patterns CP2 (refer to FIG. 5) included in the first conductive layer IS-CL1 may be directly disposed on the encapsulation layer ECL.

The first insulating layer IS-IL1 covers the second connection patterns CP2 and is disposed on the encapsulation layer ECL. The first insulating layer IS-IL1 includes a lower surface facing the encapsulation layer ECL and an upper surface on which the first sensing patterns SP1 are disposed, which is opposite to the lower surface.

The first sensing patterns SP1, the second sensing patterns SP2, and the sensing signal lines, which are included in the second conductive layer IS-CL2, are disposed on the upper surface of the first insulating layer IS-IL1. Among them, the first sensing patterns SP1 are illustrated in FIG. 7 as a representative example. Although not illustrated in figures, the first insulating layer IS-IL1 includes contact holes. The second connection patterns CP2 is electrically connected to the second sensing patterns SP2 through the contact holes.

The second insulating layer IS-IL2 covers the second conductive layer IS-CL2 and is disposed on the upper surface of the first insulating layer IS-IL1.

According to the exemplary embodiment of the present disclosure, the upper surface of the first insulating layer IS-IL1 includes the scattering pattern PT1 overlapping at least one pixel area PXA1 among the pixel areas PXA. For instance, the scattering pattern PT1 has a shape recessed downward from the upper surface of the first insulating layer IS-IL1. As a result, as illustrated in FIG. 7, a thickness V1 of a portion of the second insulating layer IS-L2, which overlaps the scattering pattern PT1, may be greater than a thickness V2 of a portion of the second insulating layer IS-IL2, which does not overlap the scattering pattern PT1.

The scattering pattern PT1 according to the present disclosure is formed on the upper surface of the first insulating layer IS-IL1 through the process of forming the contact holes of the first insulating layer IS-IL1. That is, the contact holes and the scattering pattern PT1 are provided to the first insulating layer IS-IL1 through the same process.

The scattering pattern PT1 of the first insulating layer IS-IL1 according to the present disclosure overlaps the pixel definition layer PDL and does not overlap the light shielding area NPXA. In detail, the scattering pattern PT1 may be provided on the upper surface of the first insulating layer IS-IL1 that overlaps the pixel definition layer PDL and does not overlap the light shielding layer BY when viewed in a plan view. Hereinafter, an area that overlaps the pixel definition layer PDL and does not overlap the light shielding layer BY is defined as a scattering area BD, and the scattering area BD overlaps the scattering pattern PT illustrated in FIG. 6B. In addition, the scattering area BD does not overlap the opening OM defined through the pixel definition layer PDL.

Meanwhile, FIG. 7 illustrates two scattering patterns PT1 respectively disposed in two scattering areas BD facing each other in one direction, however, the number of the scattering patterns PT1 should not be limited to two. The number of the scattering patterns PT1 corresponds to the corners of the pixel area PXA1 having the lozenge shape described with reference to FIG. 6B. For instance, the scattering pattern PT1 according to the exemplary embodiment may include four scattering patterns corresponding to four corners of the pixel area PXA1.

The scattering pattern PT1 illustrated in FIG. 7 has a semi-circular shape when viewed in a cross section. In the present disclosure, the cross section corresponds to a surface cut along a thickness direction of the display device DD.

FIGS. 8A and 8B illustrate shapes of scattering patterns according to other exemplary embodiments. Referring to FIG. 8A, the scattering pattern disposed in the scattering area BD includes a plurality of sub-scattering patterns PTa connected to each other. Each of the sub-scattering patterns PTa has a semi-circular shape when viewed in a cross section.

Referring to FIG. 8B, the scattering pattern includes a plurality of sub-scattering patterns PTb that overlaps scattering area BD. Each of the sub-scattering patterns PTb includes a first inclination surface PTb-1 and a second inclination surface PTb-2 connected to the first inclination surface PTb-1. The first inclination surface PTb-1 and the second inclination surface PTb-2 are vertical to each other.

Referring to FIG. 7 again, the scattering pattern PT1 according to the present disclosure scatters the external light reflected by the first electrode AE, and thus the intensity of the external light exiting through the pixel area PXA may be prevented from concentrating in one area. Accordingly, an overall visibility of the display device DD may be improved by the scattering pattern PT1 according to the present disclosure.

Figure 10:
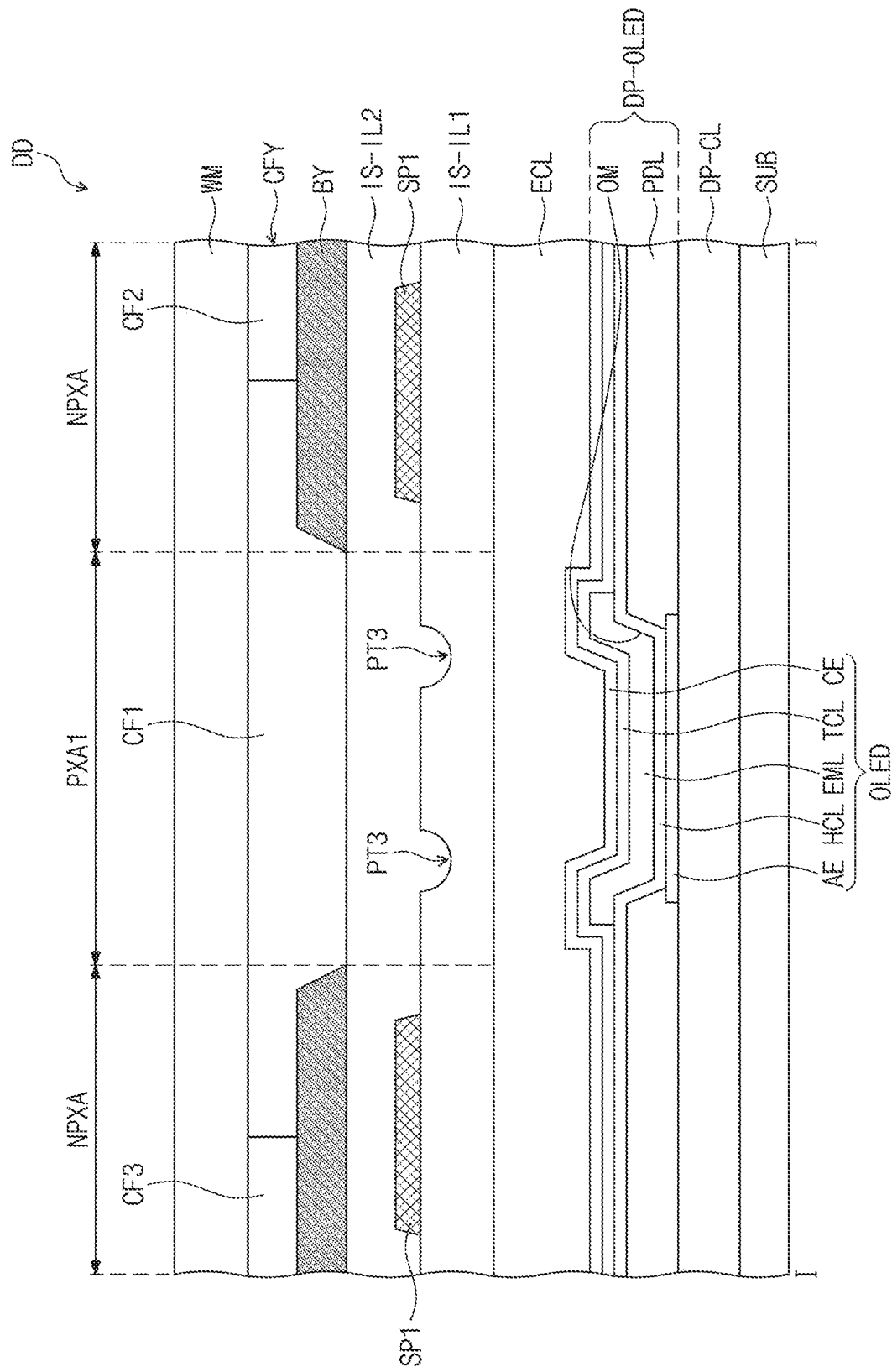
FIG. 10 is a cross-sectional view taken along a line I-I' illustrated in FIG. 6B to illustrate a display device according to another exemplary embodiment of the present disclosure.

FIG. 9 is a cross-sectional view taken along a line I-I' illustrated in FIG. 6B to illustrate a display device according to another exemplary embodiment of the present disclosure. FIG. 10 is a cross-sectional view taken along a line I-I' illustrated in FIG. 6B to illustrate a display device according to another exemplary embodiment of the present disclosure.

The display devices illustrated in FIGS. 9 and 10 have substantially the same structure as that of the display device illustrated in FIG. 7 except that a structure of the scattering pattern included in the first insulating layer IS-IL1 is changed. Therefore, the changed structure of the scattering pattern will be mainly described, and details of others will be omitted.

Referring to FIG. 9, a scattering pattern PT2 provided on an upper surface of a first insulating layer IS-IL1 may overlap a pixel area PXA1. According to the present disclosure, the scattering pattern PT2 may not overlap a pixel definition layer PDL and may overlap an opening OM defined through the pixel definition layer PDL.

According to FIG. 9, an external light OL-1 may be incident through the pixel area PXA1 and may be transmitted to the scattering pattern PT2 after being reflected by a first electrode AE. In this case, the external light OL-1 may be scattered by the scattering pattern PT2 and may exit through the pixel area PXA1 as an external light OL-2 whose intensity is reduced or may be absorbed by a light shielding layer BY.

The scattering pattern PT2 according to the present disclosure may have a semi-circular shape when viewed in a cross section. In particular, the scattering pattern PT2 that overlaps the opening OM may be provided as a single scattering pattern rather than a plurality of sub-scattering patterns.

Referring to FIG. 10, an upper surface of a first insulating layer IS-IL1 may include two scattering patterns PT3 spaced apart from each other. Each of the two scattering patterns PT3 may be provided as a single scattering pattern rather than a plurality of sub-scattering patterns.

Meanwhile, the scattering patterns illustrated in FIGS. 9 and 10 have the semi-circular shape, however, the shape of the scattering patterns should not be particularly limited.

Figure 11:
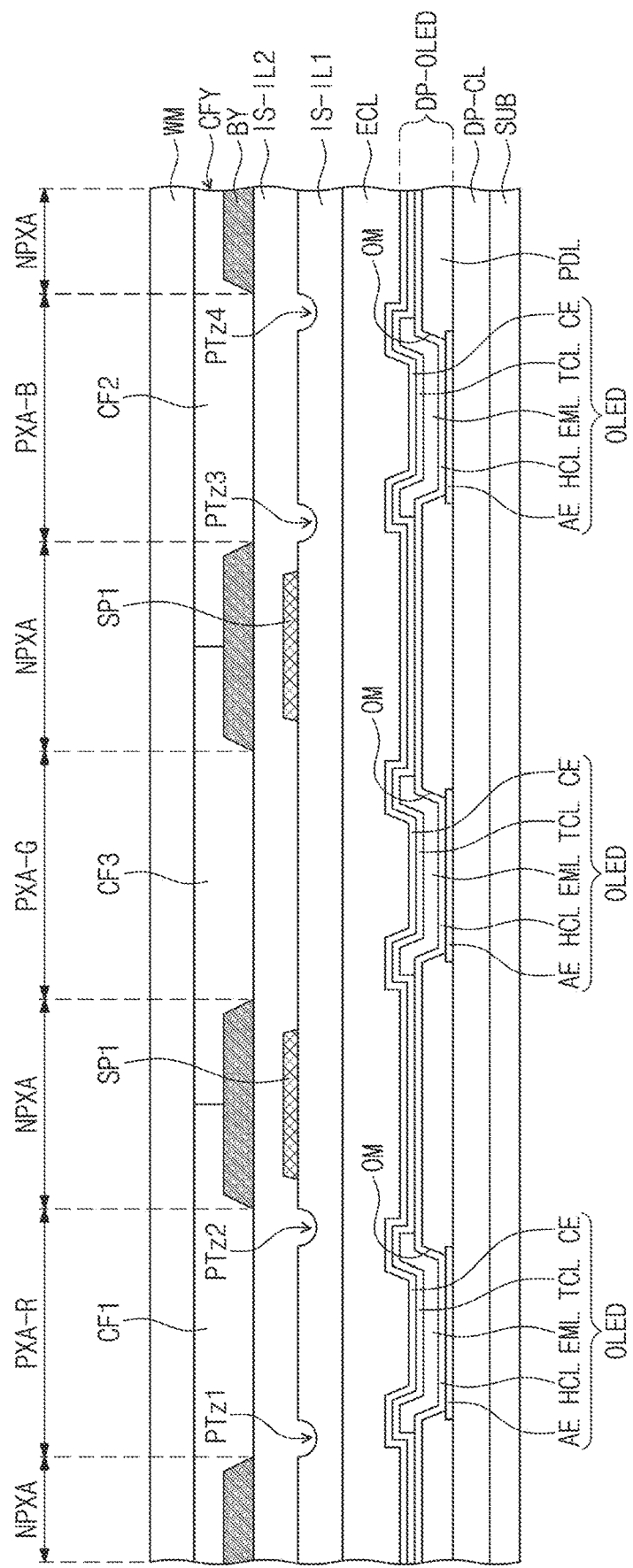
FIG. 11 is a cross-sectional view taken along a line II-II' illustrated in FIG. 6A to illustrate a display device according to another exemplary embodiment of the present disclosure.
Figure 12:
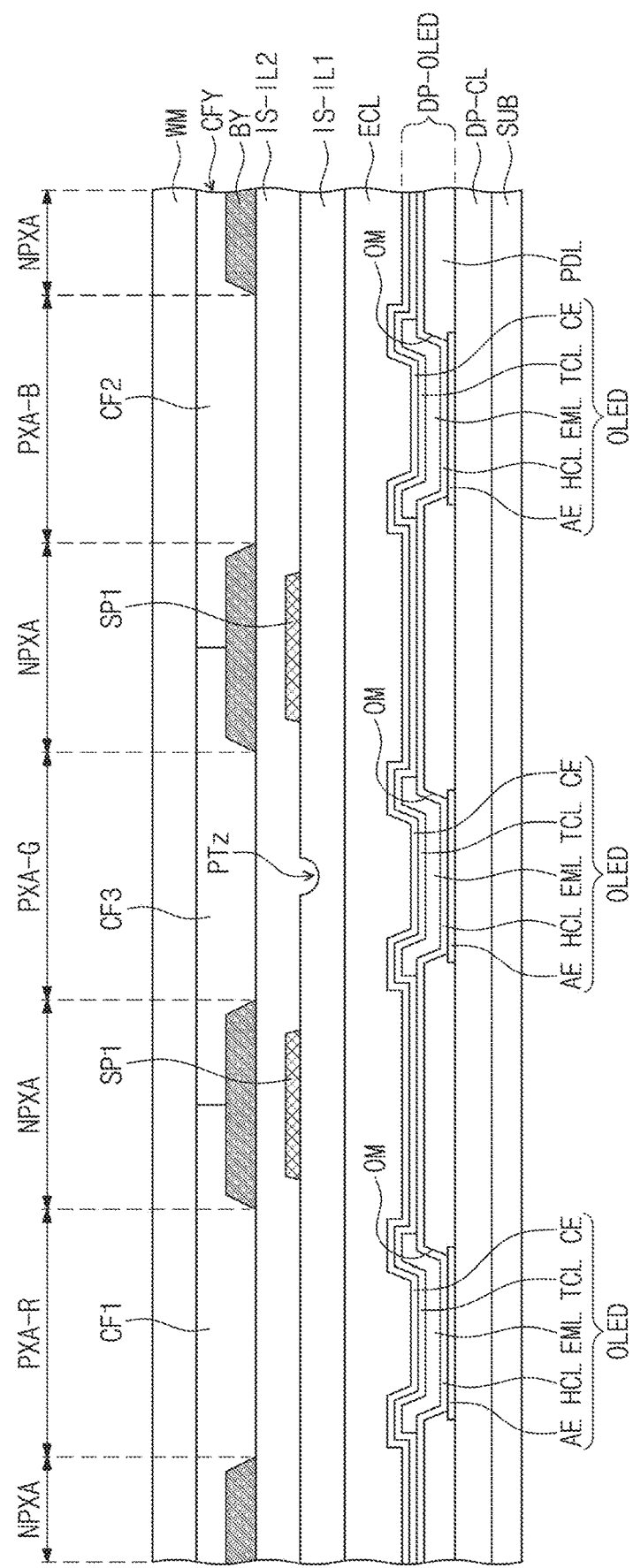
FIG. 12 is a cross-sectional view taken along a line II-II' illustrated in FIG. 6A to illustrate a display device according to another exemplary embodiment of the present disclosure.

FIG. 11 is a cross-sectional view taken along a line II-II' illustrated in FIG. 6A to illustrate a display device according to another exemplary embodiment of the present disclosure. FIG. 12 is a cross-sectional view taken along a line II-II' illustrated in FIG. 6A to illustrate a display device according to another exemplary embodiment of the present disclosure.

FIG. 11 illustrates first, second, and third pixel areas PXA-R, PXA-B, and PXA-G that emit different color lights from each other. The color filter CF1 described with reference to FIG. 7 overlaps the first pixel area PXA-R, the color filter CF2 described with reference to FIG. 7 overlaps the second pixel area PXA-B, and the color filter CF3 described with reference to FIG. 7 overlaps the third pixel area PXA-G. Actually, a red light exits through the first pixel area PXA-R, a blue light exits through the second pixel area PXA-B, and a green light exits through the third pixel area PXA-G.

According to the exemplary embodiment of the present disclosure, scattering patterns overlap two pixel areas among the first, second, and third pixel areas PXA-R, PXA-B, and PXA-G. For instance, a first scattering pattern PTz1 and a second scattering pattern PTz2 overlap the first pixel area PXA-R, and a third scattering pattern PTz3 and a fourth scattering pattern PTz4 overlap the second pixel area PXA-B.

The scattering patterns overlapping the first pixel area PXA-R and the second pixel area PXA-B shown in FIG. 11 may have substantially the same structure as that of the scattering pattern described with reference to FIG. 10, however, they should not be limited thereto or thereby. That is, the structure of the scattering patterns overlapping the first pixel area PXA-R and the second pixel area PXA-B shown in FIG. 11 may be substantially the same as that of the scattering pattern described with reference to FIG. 9. Meanwhile, the second scattering pattern PTz2 may not overlap the third pixel area PXA-G.

Referring to FIG. 12, a scattering pattern PTz may overlap one pixel area among the first, second, and third pixel areas PXA-R, PXA-B, and PXA-G. According to the present disclosure, the scattering pattern PTz may overlap the third pixel area PXA-G that overlaps a third color filter CF3 and may not overlap the first pixel area PXA-R and the second pixel area PXA-B.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a window comprising a plurality of pixel areas and a light shielding area adjacent to the pixel areas;
   a display panel comprising a base substrate, a pixel definition layer disposed on the base substrate and defining a plurality of openings respectively overlapping the pixel areas, and a plurality of organic light emitting diodes respectively overlapping the plurality of openings and emitting a light through the plurality of openings; and
   an input sensing unit disposed between the window and the display panel, the input sensing unit comprises:
   a first conductive layer comprising a first conductive pattern overlapping the light shielding area and disposed on the display panel;
   a first insulating layer covering the first conductive pattern, disposed on the display panel and comprising a scattering pattern overlapping at least one of the pixel areas;
   a second conductive layer comprising a second conductive pattern overlapping the light shielding area and disposed on the first insulating layer; and
   a second insulating layer covering the second conductive pattern and disposed on the first insulating layer.

2. The display device of claim 1, wherein the scattering pattern overlaps the pixel definition layer and does not overlap the light shielding area.

3. The display device of claim 2, wherein the at least one pixel area has a lozenge shape comprising corners, and the scattering pattern comprises a first scattering pattern and a second scattering pattern that respectively overlap two of the corners of the lozenge shape that are facing each other in one direction.

4. The display device of claim 3, wherein the scattering pattern further comprises a third scattering pattern and a fourth scattering pattern that respectively overlap other two of the corners of the lozenge shape that are facing each other in another direction substantially perpendicular to the one direction.

5. The display device of claim 2, wherein the scattering pattern comprises a plurality of sub-scattering patterns, and each of the plurality of sub-scattering pattern has a semi-circular shape.

6. The display device of claim 2, wherein the scattering pattern comprises a first inclination surface and a second inclination surface connected to the first inclination surface, and the first inclination surface and the second inclination surface are vertical to each other.

7. The display device of claim 1, wherein the first insulating layer comprises a lower surface disposed on the display panel and an upper surface facing the lower surface, and the scattering pattern has a shape recessed downward from the upper surface of the first insulating layer toward the lower surface of the first insulating layer.

8. The display device of claim 7, wherein a thickness of the second insulating layer overlapping the scattering pattern is greater than a thickness of the second insulating layer not overlapping the scattering pattern.

9. The display device of claim 7, wherein the scattering pattern has a semi-circular shape.

10. The display device of claim 1, wherein the scattering pattern overlaps one of the plurality of openings that overlaps the at least one pixel area.

11. The display device of claim 10, wherein the scattering pattern comprises a first scattering pattern and a second scattering pattern spaced apart from the first scattering pattern.

12. The display device of claim 1, wherein the pixel areas comprise a first pixel area, a second pixel area, and a third pixel area that emit different color lights from each other, and the scattering pattern overlapping the at least one pixel area overlaps one of the first, second, and third pixel areas.

13. The display device of claim 12, further comprising a color filter layer disposed between the window and the input sensing unit, wherein the color filter layer comprises:
a first color filter overlapping the first pixel area and having a first color;
a second color filter overlapping the second pixel area and having a second color; and
a third color filter overlapping the third pixel area and having a third color.

14. The display device of claim 13, wherein the first color is a red color, the second color is a blue color, the third color is a green color, and the scattering pattern overlaps the third color filter and does not overlap the first color filter and the second color filter.

15. The display device of claim 13, wherein the scattering pattern further overlaps another one of the first, second, and third pixel areas.

16. The display device of claim 15, wherein the at least one pixel area emits a red light, and the another one pixel area emits a blue light.

17. The display device of claim 1, wherein the first conductive pattern comprises a first connection pattern, the second conductive pattern comprises a first sensing pattern, a second connection pattern connecting the first sensing pattern, and a second sensing pattern electrically connected by the first connection pattern, and the first connection pattern and the second sensing pattern are electrically connected to each other through a contact hole defined in first insulating layer.

18. The display device of claim 17, wherein the first connection pattern is directly disposed on the display panel, and the contact hole is provided through the first insulating layer through a same process as the scattering pattern.

19. A display device comprising:
a window comprising a plurality of pixel areas;
a display panel comprising a base substrate, a pixel definition layer disposed on the base substrate, and comprising openings defined through the pixel definition layer, and a plurality of organic light emitting diodes respectively overlapping the openings and emitting a light through the openings;
an input sensing unit comprising a first conductive pattern, a first insulating layer covering the first conductive pattern and disposed on the display panel, a second conductive pattern disposed on the first insulating layer, and a second insulating layer covering the second conductive pattern and disposed on the first insulating layer; and
a light shielding layer disposed on the input sensing unit and surrounding the openings, wherein the first insulating layer comprises a scattering pattern overlapping at least one of the plurality of pixel areas.

20. The display device of claim 19, wherein the scattering pattern overlaps the pixel definition layer, does not overlap a light shielding area, and has a shape recessed downward from an upper surface of the first insulating layer facing the second insulating layer toward a lower surface of the first insulating layer.

21. A display device comprising:
a display panel comprising a base substrate, a pixel definition layer disposed on the base substrate and defining plurality of pixel areas and a light shielding area adjacent to the pixel areas, and a plurality of organic light emitting diodes respectively overlapping the plurality of pixel areas and emitting a light through the plurality of pixel areas; and
an input sensing unit disposed between the window and the display panel, the input sensing unit comprises:
a first conductive layer comprising a first conductive pattern overlapping the light shielding area and disposed on the display panel;
a first insulating layer covering the first conductive pattern, disposed on the display panel and comprising a scattering pattern overlapping at least one of the pixel areas;
a second conductive layer comprises a second conductive pattern overlapping the light shielding area and disposed on the first insulating layer; and
a second insulating layer covering the second conductive pattern and disposed on the first insulating layer.

* * * * *